United States Patent [19]

Miller et al.

[11] Patent Number: 4,814,746
[45] Date of Patent: Mar. 21, 1989

[54] DATA COMPRESSION METHOD

[75] Inventors: Victor S. Miller, Peekskill; Mark N. Wegman, New York, both of N.Y.

[73] Assignee: International Business Machines Corporation, Armonk, N.Y.

[21] Appl. No.: 895,120

[22] Filed: Aug. 11, 1986

Related U.S. Application Data

[63] Continuation of Ser. No. 499,943, Jun. 1, 1983, abandoned.

[51] Int. Cl.$^4$ ........................................... H03M 7/00
[52] U.S. Cl. .................................... 341/95; 364/200; 364/900
[58] Field of Search ............... 340/347 DD; 364/200, 364/900

[56] References Cited

U.S. PATENT DOCUMENTS 4,386,416  5/1983  Giltner et al. ..................... 364/900
4,464,650  8/1984  Eastman ..................... 340/347 DD

FOREIGN PATENT DOCUMENTS 129439  12/1984  European Pat. Off. .

OTHER PUBLICATIONS

Ziv et al., "Compression of Individual Sequences Via Variable-Rate Coding"; IEEE TRans. on Info. Theory; vol. IT-24, No. 5; pp. 530-536.

Langdon, Jr., "A Note on the Ziv-Lempel Model for Compressing Individual Sequences"; IEEE Trans. on Info. Theory; vol. IT-29, No. 2; pp. 284-287.

*Primary Examiner*—William M. Shoop, Jr.
*Assistant Examiner*—Richard K. Blum
*Attorney, Agent, or Firm*—Thomas P. Dowd

[57] ABSTRACT

Communications between a Host Computing System and a number of remote terminals is enhanced by a data compression method which modifies the data compression method of Lempel and Ziv by addition of new character and new string extensions to improve the compression ratio, and deletion of a least recently used routine to limit the encoding tables to a fixed size to significantly improve data transmission efficiency.

18 Claims, 5 Drawing Sheets

LZ with new
string extension
and LRU

LZ with new
string extension
and LRU

LZ with new
string extension

DATA COMPRESSION METHOD

This application is a continuation of our earlier application Ser. No. 499,943, filed on June 1, 1983, now abandoned.

BACKGROUND OF THE INVENTION

1. Field of the Invention

The present invention relates to data processing methods and more particularly to methods for compression of data for transmission or storage.

2. Description of the Prior Art

In the prior art there are many data compressing methods. The following are methods representative of the prior art.

An article entitled "Compression of Individual Sequences via Variable Rate Coding" by Ziv and Lempel published in the IEEE Transactions on Information Theory IT-24 pp 530–536, discloses a basic algorithm on which the present invention is an improvement. The structure, operation, advantages and disadvantages of the Lempel-Ziv method are discussed in greater detail in the Description of a Preferred Embodiment of the Present Invention. The prior art discussed above does not teach nor suggest the present invention as disclosed and claimed herein.

SUMMARY OF THE INVENTION

Therefore, it is an object of the present invention to compress data for storage or transmission by a method including a character extension improvement, a string extension improvement, and an LRU algorithm improvement to enhance transmission efficiency and to reduce line costs in remote terminal data communications systems.

It is another object of the present invention to compress data for storage or transmission by a method including the steps of: initializing a set of strings to consist of n sequences; determining a longest string S of the set which matches a current string; generating an identifier I for S; transmitting I to a utilization device; testing dictionary for an empty slot; deleting a least recently used (LRU) string from dictionary if no empty slot is found to create an empty slot; assigning a slot identifier j to said empty slot found or created from the above steps of testing and deleting; adding a new string S' to said set where S' comprises a concatention of a previous string match and said current string match; assigning an identifier k to string S'; advancing the input position to a next character in said stream; outputing an identifier m to indicate a match; and repeating the above steps for a next string.

It is yet another object of the present invention to control data transmission between a host computing system and one or more remote terminals by the method set forth above.

Accordingly, a data compression and terminal communications control method according to the present invention includes the steps of: initializing a set of strings to consist of n sequences; determining a longest string S of the set which matches a current string; generating an identifier I for S; transmitting I to a utilization device; testing dictionary for an empty slot; deleting a least recently used string from dictionary if no empty slot is found to create an empty slot; assigning a slot identifier j to said empty slot found or created from the above steps of testing and deleting; adding a new string S' to said set where S' comprises a concatentation of a previous string match and said current string match; assigning an identifier k to string S'; advancing the input position to a next character in said stream; outputing an identifier m to indicate a match; and repeating the above steps for a next string.

The foregoing and other objects, features and advantages of the invention will be apparent from the more particular description of the preferred embodiments of the invention, as illustrated in the accompanying drawing.

BRIEF DESCRIPTION OF THE DRAWING

In the drawing, like elements are designated with similar reference numbers, and identical elements in different specific embodiments are designated by identical reference numbers.

DESCRIPTION OF PREFERRED EMBODIMENTS OF THE INVENTION

The Prior Art Compression Methods of Lempel and Ziv

Figure 1:
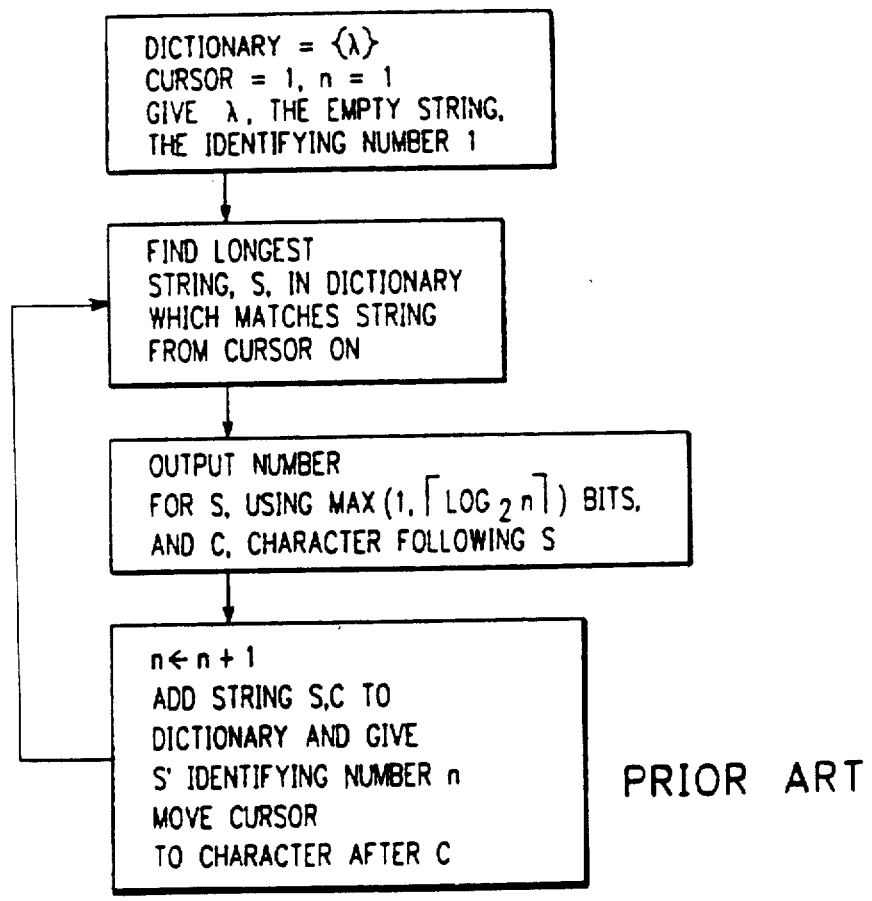
FIG. 1 is a flow chart of a Prior Art method for data compression.

Lempel and Zev (LZ) propose two related methods for data compression which are based on the theory of algorithmic complexity, rather than more traditional probability based approaches. The second, simpler, method can be implemented straightforwardly and efficiently, and produces satisfactory compression on most data. However, the method has some shortcomings, which are remedied by the present invention. In the following discussion, the term encoder is used for the compression program, and decoder for the inverse operation. The LZ algorithm is shown in FIG. 1.

It is adaptive. Thus, it can work on a wide variety of different file types and still get acceptable performance.

It can be thought of as a general model for compression. Both the encoder and the decoder maintain a dictionary of strings, and at every point those dictionaries change in lock-step, so that bits need not be used to transmit the dictionary. This is possible because strings are only added to the dictionary after the decoder would have seen them, and it uses the exact same strategy for adding them to the dictionary as the encoder.

LZ records probable events and does not waste space with information about improbable events. If one wanted to have a Huffman code compressing all pairs of characters, one would need 64k pieces of information. And one would only have information about diagram frequency. (An n-gram is a string of n characters). With the above method if there is a 100-gram which is more common than a single letter, the system will "learn" that 100-gram first.

It may well be more important to store information that strings of 80 blanks long (lines) occur often than that the letter "z" appears with some given frequency. Lines of blanks wil be more important than the letter 'z' if they occur more often, and this is precisely the case when LZ stores information on them.

Another feature is that there is a good representation for the dictionary. It is possible to keep a fixed number of bits for each dictionary entry, no matter how long the string of characters represented by that dictionary entry is.

The first problem with the above method is that part of the output consists of uncompressed symbols from the input. While this is of little consequence asymptotically, it is of significant consequence for practical data. For example, if a file is partitioned into 20,000 sequences by the above algorithm, over one-third of the output will consist of uncompressed characters.

THE PRESENT INVENTION

The solution proposed here avoids transmitting any uncompressed data. The entire output consists of a sequence of identifying numbers. The present invention will be described with reference to FIGS. 2, 3, 4, and 5.

Figure 2:
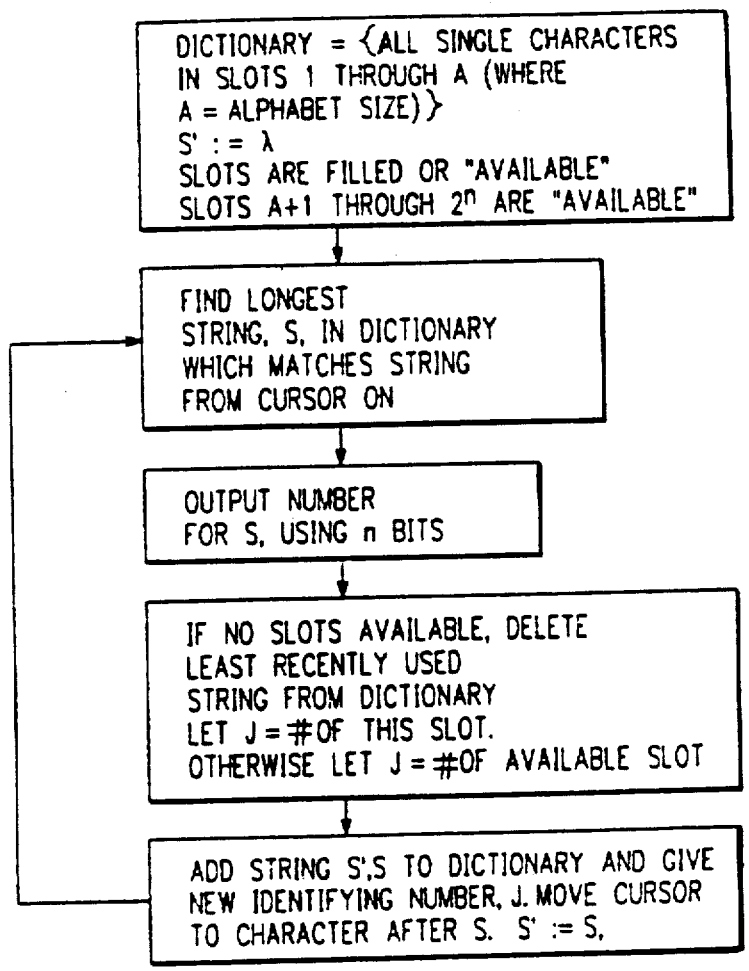
FIG. 2 is a flow chart of a data compression method according to the present invention including each component thereof.
Figure 3:
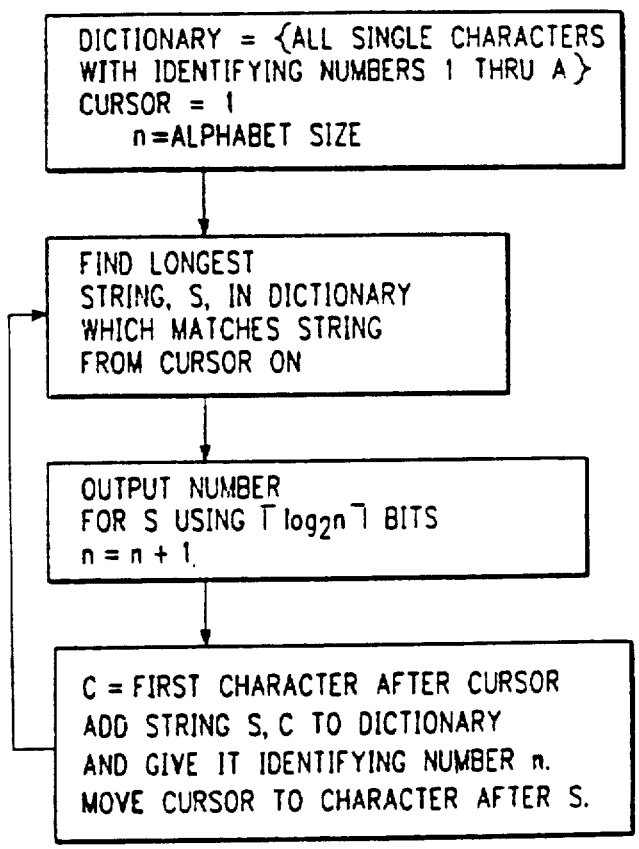
FIG. 3 is a flow chart of a first component of a data compression method according to the present invention.
Figure 4:
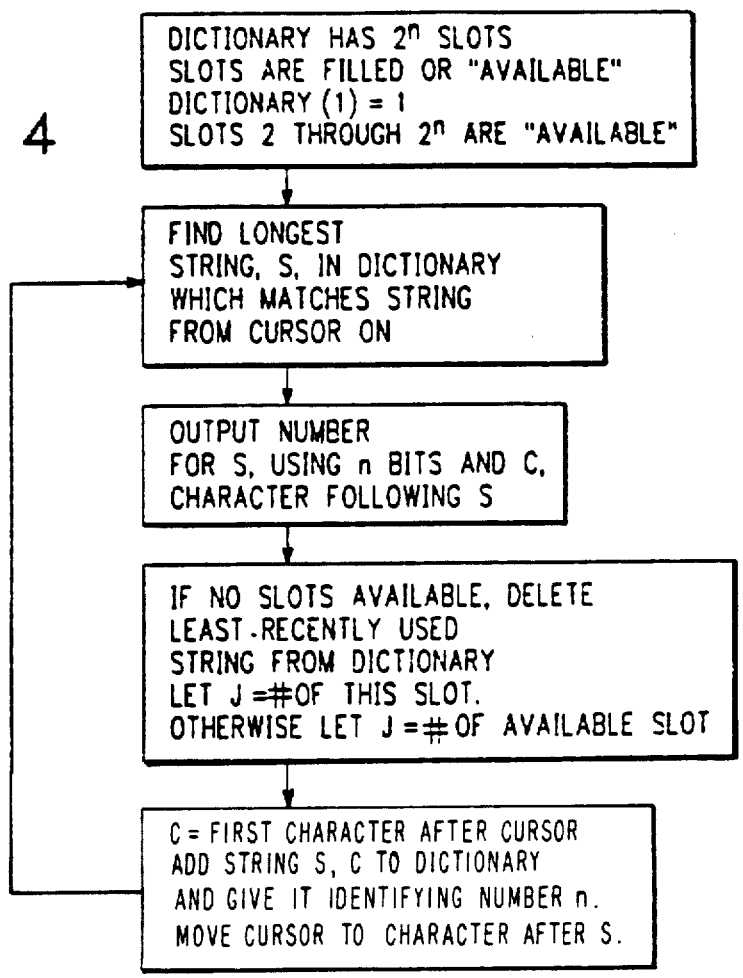
FIG. 4 is a flow chart of a second component of a data compression method according to the present invention.
Figure 5:
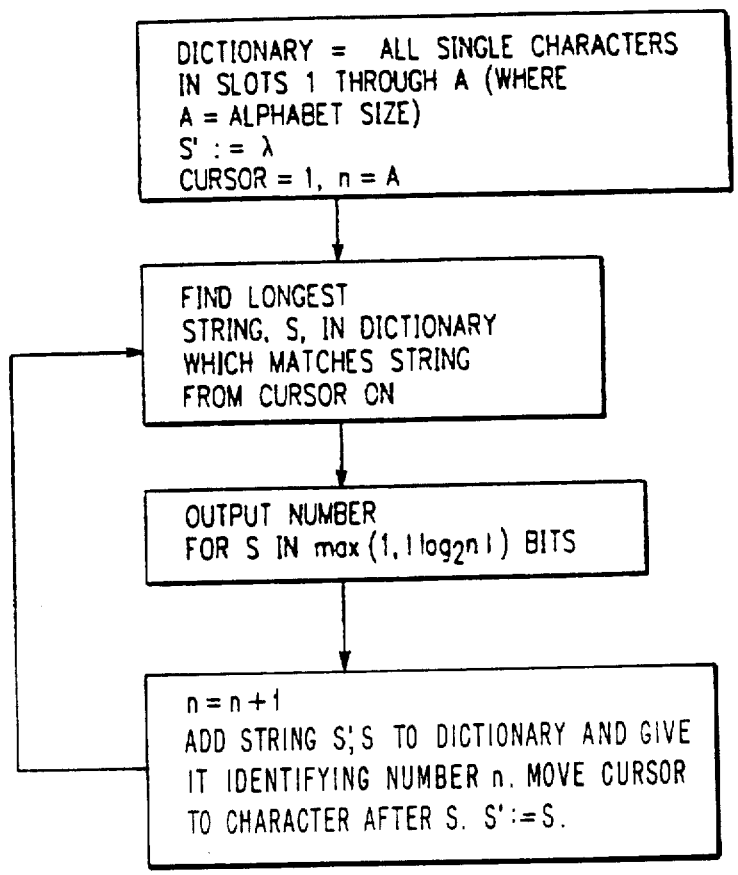
FIG. 5 is a flow chart of a third component of a data compression method according to the present invention.

Referring now to FIG. 2, the method according to the present invention will be described.

The first step of the present invention initializes the dictionary to contain all strings of length l, instead of initializing the dictionary to contain the empty string. Thus, a match is always found. The dictionary must be augmented by adding the string S concatenated with the first character of the next string which is matched. This new string is added after the next match has been found.

Next, in step 2, since a string is always known, the longest string, S, is found in the dictionary which matches the current string in the data stream from the cursor forward.

Another assumption made by Lempel and Ziv is that the dictionary can grow to an infinite size. This is clearly not practical. The method recommended by Lempel and Ziv is to block the input, into those segments whose dictionaries just fill up available space, compressing each block independently. However it is more advantageous to replace individual strings in the dictionary. Step 3 of the present method discards strings which have been in some sense least recently used. (See FIG. 4) A string is defined as "used" if it is matched, or is a prefix of a match. The other definition associates a reference count with each string in the dictionary. The reference count of a string S, is the number of strings in the dictionary which are of the form S || T, or T || S, for some T (S || S is counted twice). Among those strings with reference count 0, the one whose reference count has been 0 the longest is the "least recently used."

In some sense the dictionary should be filled with the natural units of the file being compressed. In English this would mean that most entries in the dictionary would be words, or even phrases. However, the method used to build up larger units must go through transitions which are not units. So, one might have the a unit composed of one word, plus the first half of another word. It is less likely to have the last part of that word in the dictionary, than the whole word. Moreover, if pieces of words are stored in the dictionary, they may make the dictionary bigger than it should be. For example if three fourths of the dictionary has strings which are never, or rarely used then two extra bits will be used in the transmission of each bit so that these useless entries can be referred to. Furthermore, it takes a long time to adapt to long strings. All these problems can be eliminated or ameliorated by adding into the dictionary entries which are the concatenation of two matches rather than the concatenation of the first match and the first character of the second match.

Combining the three concepts, a powerful encoder is achieved whose embodiment is discussed next.

The major difficulties in obtaining a practical implementation are in finding a good data structure for the dictionary of strings. This structure should be small, yet allow rapid searches.

First will be described a data structure sufficient for all the encodings save the last presented. The size for all these structures is proportional to the number of strings in the dictionary, and does not depend on the size of the strings.

In the first encodings all strings, S, in the dictionary are either one character longer than a prefix, P, of S, with P being in the dictionary, or S is one character long. Thus the dictionary resembles a tree. The root of the tree is the empty string. Each node (except for the root) is the child of the node representing the string labeling the node with the last symbol omitted. In the encoding algorithm the recognition is accomplished by first recognizing a prefix and then seeing if it has a child which matches the next character. Let n be a node with parent, P, C being the last character of the string corresponding to n (the character which is not in the string corresponding to P). A hash table, which may be implemented by one of a number of hash functions, such as is shown in "Universal Classes of Hash Functions" J. Lawrence Carter and Mark N. Wegman, Journal of Computer and System Sciences Vol 18 No 2 April 79, pp 143-154, indexed by the pair (P,C) returns n if there is such a child. Hashing techniques are well known to those skilled in the art and need not be set forth in detail herein. Thus, given a node, one can quickly tell if there is a longer match. The decoding algorithm works similarly, but instead of a hash table a simple pointer from n to P suffices.

The least recently used encoding presents little problem. The only thing worth noting is that holes cannot be left in the dictionary. Thus the string 'abc' cannot stay in the dictionary when the string 'ab' is thrown out. The simplest strategy is to only place strings on the LRU list when they are leaves of the tree. Thus, a new string or one whose children have been deleted become candidates for deletion.

The string concatenation method is more difficult. Two data structures must be maintained. One structure is called the discriminator tree, and is used to rapidly find candidates for matches. This structure resembles the above dictionary and is similar to a prefix tree. The other data structure is called the pair forest and it allows one to choose between the candidates. The pair forest succinctly represents all strings. Each string is represented by a node. A node is either a character, or two pointers to other nodes. Thus one concatenation of two strings in the dictionary can be represented by a node which points to both. All nodes in the forest are placed in an array, the ith element of which points to the ith string in the dictionary.

The discriminator tree maintains the property that the parent, P, of a node, n, corresponds to a prefix of the string represented by n. However the prefix may be more than one character shorter. Moreover, not all nodes in the tree necessarily correspond to strings in the dictionary; they may be prefixes of strings in the dictionary.

All strings in the dictionary which are not prefixes of other strings in the dictionary correspond to leaves in the discriminator tree. All other strings in the dictionary are also placed in the tree as internal nodes. If S is the prefix of two or more strings, S:sub./1/ and S:sub./2/, which are in the dictionary and S is the longest such string, then a node N, corresponding to S is in the tree, even if S is not in the dictionary. Since we cannot store S efficiently, we store in n a pointer to either S:sub./1/ or S:sub./2/ in the pair forest. From this information it is possible to re-create S.

With each node is stored the length of the string that it matches. A hash table, as above, allows us to find the appropriate child from a parent. So, if we are trying to match a string which is a leaf in the tree, start at the root, and hash the first character to find the next node. From this node find the length of the string it matches, and hence the character beyond it. Hash the node and that character to obtain the next node. This process is repeated to find a candidate match. A problem arises if the candidate match does not match the text on a character which was not used in the hashing process.

At this pont the real match in the dictionary must either be the string found by the discriminator tree or a prefix of it. The pair forest is used to find the longest prefix of the candidate match that matches the text being compressed. As this process goes on, the discriminator tree is scanned to find the longest string in the dictionary which corresponds to this prefix. That string is the correct match.

It should be pointed out, that in the string extension algorithm the possibility arises that when adding a string to the discriminator tree, that it is already there. In that case no changes should be made to the discriminator tree.

The method proposed herein can also be used to produce a probability distribution for the next character in a string of characters (or bit in a string of bits). This may be useful in applications involving recognizing data. For example, optical scanners can often tell that a particular character is either an "n" or an "h". However, they may have difficulty distinguishing between them. In such a case, if the probability is very low of an "h" following the current string of characters, the scanner might decide that the next character is an "n". Another example is recognizing Phonemes or words in speech recognition.

A number of authors have shown that any compression method can be used to make a prediction. For example, see Thomas M. Cover "Universal Gambling Schemes and the Complexity Measures of Kolmogorov and Chaitin" in technical report no. 12, Oct. 14, 1974, Dept. of Statistics, Stanford University.

The following program listing, set forth in the PLI language embodies all steps of the present invention. The program may be run on an IBM 370 Model 3081 series mainframe computing system.

```
lzs:proc(string, n);
  dcl string char(*);
  dcl n fixed bin(31);
  dcl dicthigh fixed bin(31);
  dicthigh=2**n;
  dcl 1 compdict(0: dicthigh) ctl,
    2 left fixed bin(31),
```

-continued

```
    2 right fixed bin(31),
    2 len fixed bin(31),
    2 next fixed bin(31),
    2 prev fixed bin(31),
    2 father fixed bin(31);
  dcl i fixed bin(31) /*loop index*/;
  dcl cursor fixed bin(31) init(1);
  dcl b fixed bin(31) init(256);
  dcl lengthmatch fixed bin(31);
  dcl indexmatch fixed bin(31);
  dcl freeident fixed bin(31);
  dcl remaining fixed bin(31);
  dcl (length,substr,unspec,null,empty,addr) builtin;
  dcl out entry (fixed bin(31),fixed bin(31));
  dcl avail fixed bin(31);
  dcl s,s_prime) fixed bin(31);
  call initialize;
  /* end step 1*/
  do while (cursor < = length (string));
    remaining=length(string)-cursor+1;
    call find_longest_match_at_cursor;
    cursor = cursor + lengthmatch;
    /* end step2*/
    call out(indexmatch,n);
    s=indexmatch;
    /*3) Output the identifying number for s, using n bits. */
    freeident=get_available_slot;
    /* remember the identifying number of the free slot */
    call delete_ref(left(freeident));
    call delete_ref(right(freeident));
    left(freeident)=s_prime;
    right(freeident)=s;
    len(freeident)=len(s)+len(s_prime);
    call bump_ref(s_prime);
    call bump_ref(s);
    call add_to_zero_ref_list(freeident);
    /*end step4*/
    s_prime=s;
  end;
  free compdict;
  initialize:proc;
    dcl i fixed bin(31);
    allocate compdict;
    cursor=1;
    do i=1 to dicthigh;
      left(i)=0;
      right(i)=0;
      len(i)=0;
    end;
    do i=1 to 256;
      next(i)= -1;
      len(i)=1;
    end;
    do i=257 to dicthigh;
      next(i)=i+1;
    end;
    next(dicthigh)=0;
    avail=257;
  end;
  match:proc(node, pos)returns(bit(1)) recursive;
    dcl (node,pos) fixed bin(31);
    dcl cc fixed bin(31);
    dcl c char(4) based(addr(cc));
    if node< =256 then do;
      cc=node -1;
      return(substr(c,4,1)=substr(string,pos,1));
    end;
    if match(left(node),pos) then return ('0'b);
    return(match(right(node),pos+len(left(node))));
  end match;
  bump_ref:proc(i);
    dcl(i,k,l)fixed bin(31);
    if i=0 then return;
    if next(i)<0 then do;
      next(i)=next(i)-1;
      return;
    end;
    /* remove from 0 reference list */
    k=next(i);
    l=prev(i);
    prev(k)=l;
    next(l)=k;
```

-continued

```
    next(i) = -1;
end;
delete_ref:proc(i);
    dcl(i,k,l)fixed bin(31);
    if i=0 then return;
    next(i) = next(i) + 1;
    if next(i) = 0 then return;
    call add_to_zero_ref_list(i);
end;
add_to_zero_ref_list:proc(i);
    dcl (i,k,l) fixed bin(31);
    k = prev(l);
    prev(i) = k;
    next(k) = i;
    next(i) = 0;
    prev(0) = i;
end;
get_available_slot:proc returns(fixed bin(31));
    dcl (k,l) fixed bin(31);
    if avail=0 then do;
        k = avail;
        avail = next(avail);
        return(k);
    end;
    /* otherwise remove someone from the lru */
    k = next(0);
    l = next(k);
    next(0) = l;
    prev(l) = 0;
    return(k);
end;
find_longest_match_at_cursor:proc;
    dcl i fixed bin(31);
    dcl l fixed bin(31);
    lengthmatch = 0;
    indexmatch = 0;
    do i = 1 to dicthigh;
        l = len(i);
        if l > lengthmatch then do;
            if l < = remaining then
                if match(i,cursor) then
                    do; lengthmatch = l; indexmatch = i; end;
        end;
    end;
end;
```

Thus, while the invention has been described with reference to preferred embodiments thereof, it will be understood by those skilled in the art that various changes in form and details may be made without departing from the scope of the invention.

What is claimed is:

1. A method for data compression of individual sequences or strings of symbols arranged in a data stream, comprising the steps of:

initializing a dictionary consisting of a set of strings with an index for each of said strings and including all possible strings of length l;

setting a current input position at the beginning of said data stream and repeating the following steps until the data stream to be compressed is exhausted;

determining a longest string S in said dictionary which matches a current string in the data stream starting from the current input position;

generating an identifier I for S consisting of an encoding of the index associated with said longest matched string S;

advancing the current input position to immediately after said current string in the data stream;

modifying said dictionary based on the preceding longest matched string S, the immediately succeeding symbols in the next string in the data stream, and the sequence of previously matched strings;

transmitting I to a utilization device; and decoding I at said utilization device to recover said string S.

2. A method for data compression of individual sequences or strings of characters in a data stream comprising the steps of:

initializing a set of strings into a dictionary consisting of n strings each with an identifier and including all possible strings of length l;

setting a current input position at the beginning of said data stream;

determining the longest string S in the dictionary which matches the current string of characters of the data stream starting at the current input position;

finding the identifier I for S;

transmitting I to a utilization device;

decoding I at said utilization device to recover said string S;

adding a new string S' to said dictionary where S' comprises a concatenation of a previous string match and said current string match;

generating and assigning an identifier I' to string S';

advancing the current input position to a next character in said stream following the current matched string; and repeating the above determining, finding, transmitting, decoding, adding, generating and assigning, and advancing steps for a next string until the data stream to be compressed is exhausted.

3. A method according to claim 2, further comprising the step of:

deleting a least recently used string from said dictionary to create an empty slot for said new string S', if no empty slot is found when modifying said dictionary.

4. A method for creating a dynamic dictionary of fixed size to be used in achieving data compression of individual sequences or strings of symbols in a data stream, comprising the steps of:

initializing a set of strings to consist of n sequences of symbols including all possible strings of length l;

providing a dictionary of fixed size in storage containing said initialized set of strings each with an identifier;

determining a longest string S of the set which matches a current string of the data stream to be compressed;

testing said dictionary of fixed size in storage containing said set of strings for an empty slot to store a new matched string;

deleting a least recently used string from said dictionary, if no empty slot is found, to create an empty slot; and assigning a slot identifier j to said empty slot found or created from the above steps of testing and deleting to identify a new matched string stored therein.

5. A method for data compression of individual sequences in a data stream, comprising the steps of: initializing a set of strings to consist of n sequences; determining a longest string S of the set which matches a current string; generating an identifier I for S; transmitting I to a utilization device; testing a dictionary in storage containing said set of strings for an empty slot; deleting a least recently used string from said dictionary if no empty slot is found to create an empty slot; assigning slot identifier j to said empty slot found or created from the above steps of testing and deleting; adding a new string S' to said set where S' comprises a concatenation of a previous string match and said current string match; assigning an identifier k to string S'; advancing the input position to a next character in said stream; outputting an identifier m to indicate a match; and repeating the above steps for a next string.

6. A method according to claim 1, wherein said modifying step comprises the steps of:
adding a new string S' to said set, where S' comprises a concatenation of a previous string match and said current string match; and
assigning an identifier I' to said string S'.

7. A method according to claim 1, wherein said modifying step comprises the steps of:
adding a new string S' to said set, where S' comprises a concatenation of said current string match and an immediately succeeding symbol in said data stream; and
assigning an identifier I' to said string S'.

8. A method according to claim 1, further comprising the step of:
testing a dictionary of fixed size in storage containing said set of strings for an empty slot to store said new string S'.

9. A method according to claim 8, further comprising the step of:
deleting a least recently used string from said dictionary to create an empty slot, if no empty slot is found.

10. A system for data compression of individual sequences or strings of symbols arranged in a data stream, comprising:
means for initializing a dictionary consisting of a set of strings with an index for each of said strings and including all possible strings of length 1;
means for setting a current input position at the beginning of said data stream;
means for determining the longest string S in said dictionary which matches a current string in the data stream starting from the current input position;
means for generating an identifier I for S consisting of an encoding of the index associated with said longest matched string S;
means for advancing the current input position to immediately after said current string in the data stream;
means for modifying said dictionary based on the preceeding longest matched string S, the immediately succeeding symbols in the next string in the data stream, and the sequence of previously matched strings;
means for transmitting I to a utilization device;
means for decoding I at said utilization device to recover said string S; and
means for repeatedly activating said determining, generating, advancing, modifying, transmitting, and decoding means until the data stream to be compressed is exhausted.

11. A system as in claim 10, wherein said modifying means comprises:
means for adding a new string S' to said set, where S' comprises a concatenation of a previous string match and said current string match; and means for assigning an identifier I' to string S'.

12. A system as in claim 10, wherein said modifying means comprises:
means for adding a new string S' to said set, where S' comprises a concatenation of said current string match and an immediately succeeding symbol in said data stream; and
means for assigning an identifier I' to string S'.

13. A system according to claim 10, further comprising:
means for storing a dictionary of fixed size containing said set of strings; and
means for testing said dictionary for an empty slot to store said new string S'.

14. A system according to claim 13, further comprising:
means for deleting a least recently used string from said dictionary to create an empty slot, if no empty slot is found.

15. A system for data compression of individual sequences or strings of characters in a data stream, comprising:
means for initializing a set of strings into a dictionary consisting of n strings each with an identifier and including all possible strings of length 1;
means for setting a current input position at the beginning of said data stream;
means for determining the longest string S in the dictionary which matches the current string of characters of the data stream starting at the current input position;
means for finding the identifier I for S;
means for transmitting I to a utilization device;
means for decoding I at said utilization device to recover said string S;
means for adding a new string S' to said dictionary, where S' comprises a concatenation of said current string match and at least one of a previous string match and an immediately succeeding character in said data stream;
means for generating and assigning an identifier I' to string S';
means for advancing the current input position to a next character in said stream following the current matched string;
means for repeatedly actuating said determining, finding, transmitting, decoding, adding, generating and assigning, and advancing means to operate on a next string until the data stream to be compressed is exhausted.

16. A system according to claim 15, further comprising:
means for deleting a least recently used string from said dictionary to create an empty slot for said new string S', if no empty slot is found when adding said new string to said dictionary.

17. A system for creating a dynamic dictionary of fixed size to be used in achieving data compression of individual sequences or strings of symbols in a data stream, comprising:
means for initializing a set of strings to consist of n sequences of symbols including all possible strings of length 1;
means for determining a longest string S of the set which matches a current string of the data stream to be compressed;
means for storing a dictionary of fixed size containing said intialized set of strings each with an identifier;
means for testing said dictionary for an empty slot to store a new matched string;
means for deleting a least recently used string from said dictionary, if no empty slot is found, to create an empty slot; and means for assigning a slot identifier j to said empty slot found or created following the operation of said testing and deleting means to identify a new matched string stored therein.

18. A system for data compression of individual sequences or strings in a data stream, comprising:
   means for initializing a set of strings to consist of n sequences;
   means for determining a longest string S of the set which matches a current string to be compressed;
   means for generating an identifier I for S;
   means for transmitting I to a utilization device;
   storage means comprising a dictionary containing said set of strings;
   means for testing said dictionary in storage for an empty slot;
   means for deleting a least recently used string from said dictionary, if no empty slot is found, to create an empty slot;
   means for assigning slot identifier j to said empty slot found or created by said testing and deleting means;
   means for adding a new string S' to said set where S' comprises a concatenation of a previous string match and said current string match;
   means for assigning an identifier k to said string S';
   means for advancing the input position to a next character in said stream;
   means for outputting an identifier m to indicate a match; and
   means for repeatedly actuating said foregoing means for a next string.

* * * * *